(12) United States Patent
Tseng et al.

(10) Patent No.: US 9,264,042 B2
(45) Date of Patent: Feb. 16, 2016

(54) SERIAL TRANSMISSION DRIVING METHOD

(71) Applicant: Amazing Microelectronic Corp., New Taipei (TW)

(72) Inventors: Tang-Kuei Tseng, Hsinchu County (TW); Chih-Hao Chen, Taipei (TW); Szu-Hsien Wu, Taipei (TW); Ryan Hsin-Chin Jiang, Taipei (TW)

(73) Assignee: AMAZING MICROELECTRONIC CORP., New Taipei (TW)

( * ) Notice: Subject to any disclaimer, the term of this patent is extended or adjusted under 35 U.S.C. 154(b) by 117 days.

(21) Appl. No.: 14/199,448

(22) Filed: Mar. 6, 2014

(65) Prior Publication Data

US 2015/0145557 A1    May 28, 2015

(30) Foreign Application Priority Data

Nov. 27, 2013   (CN) .......................... 2013 1 0613077

(51) Int. Cl.
| | |
|---|---|
| *H03K 19/0175* | (2006.01) |
| *H03K 19/00* | (2006.01) |
| *H04B 1/38* | (2015.01) |
| *H04L 5/16* | (2006.01) |
| *H03K 19/003* | (2006.01) |
| *H03K 19/01* | (2006.01) |

(52) U.S. Cl.
CPC ...... *H03K 19/00346* (2013.01); *H03K 19/0005* (2013.01); *H03K 19/01* (2013.01); *H03K 19/017509* (2013.01)

(58) Field of Classification Search
CPC .......... H03K 19/0346; H03K 19/0005; H03K 19/01; H03K 19/017509
USPC ................ 326/31, 82; 327/108, 111; 375/220
See application file for complete search history.

(56) References Cited

U.S. PATENT DOCUMENTS

| | | | |
|---|---|---|---|
| 2008/0037617 A1* | 2/2008 | Tang et al. ..................... | 375/220 |
| 2010/0321069 A1* | 12/2010 | Komatsu et al. ............... | 327/108 |
| 2015/0145557 A1* | 5/2015 | Tseng et al. .................... | 326/31 |

FOREIGN PATENT DOCUMENTS

CN    101834594 A    9/2010

* cited by examiner

*Primary Examiner* — Daniel D Chang
(74) *Attorney, Agent, or Firm* — Muncy, Geissler, Olds & Lowe PC

(57) ABSTRACT

The present invention discloses a serial transmission driving method, wherein a serial transmission driving device (STD) is connected with a first terminal (FT) and a second terminal (ST) of an equivalent load capacitor through a first differential bus (FDB) and a second differential bus (SDB). FDB and SDB are respectively connected with a high-potential terminal (HPT) and a low-potential terminal (LPT) through a first equivalent resistor and a second equivalent resistor. STD receives a trigger signal (TS) appearing during the transition between a turn-on signal (Ton) and a turn-off signal (Toff), generates a first potential (FP) and a second potential (SP) greater than FP according to TS, and respectively applies FP and SP to SDB and FDB. FP and SP fast change the potential of FT to be greater than that of ST. HPT and LPT maintain potentials of FDB and SDB until Toff ends.

3 Claims, 6 Drawing Sheets

SERIAL TRANSMISSION DRIVING METHOD

This application claims priority for People's Republic of China patent application no. 201310613077.1 filed on Nov. 27, 2013, the content of which is incorporated in its entirely.

BACKGROUND OF THE INVENTION

1. Field of the Invention

The present invention relates to a driving technology, particularly to a serial transmission driving method.

2. Description of the Related Art

The control unit of an industrial control device normally has a serial transmission interface for communication and control. A serial transmission interface has two differential buses to connect with the serial interfaces of the other control units. One differential bus is normally connected with a plurality of control units. The more the control units, the heavier the equivalent load. Therefore, a serial transmission interface is normally hard to drive too many devices in various applications.

Refer to FIG. 1, wherein two differential buses 10 and 12 are connected with a plurality of components, and wherein a component 30 comprises an interface chip 14, a processor 16, a first optical coupler 24, a second optical coupler 26 and a protection element 15. While the differential bus is connected with a plurality of components, the total load thereof, which is represented by a load capacitor 18, is considerably great. The two differential buses 10 and 12 are respectively connected with a high-voltage terminal VCC and a ground terminal through resistors 20 and 22. In the application of the serial transmission interface, only two optical couplers 24 and 26 are arranged between the processor 16 and the interface chip 14, considering the cost factor. The first optical coupler 24 is used in the receiving terminal (a first terminal) of the interface chip 14. The second optical coupler 26 is used in the control terminals (a second terminal and a third terminal) or the data input terminal (a fourth terminal) of the interface chip 14. Because the second optical coupler 26 is simultaneously applied to the control terminals and the data input terminal, the application thereof is considerably limited. The practical limitation is as follows: the transmitter 28 of the interface chip 14 can only transmit the "0" signal because the fourth terminal is grounded equivalently. The "1" signal must be pulled by the resistors 20 and 22. However, the load capacitor 18 is very great because many components and long lines are attached to the two differential buses 10 and 12. Thus, the resistors 20 and 22 are hard to pull the "1" signal. Therefore, the abovementioned serial transmission interface cannot be used in high-speed transmission but can only be used in low-speed transmission.

Below, the conventional technology where two interface chips 14 and 30 transmit signals mutually is described. Refer to FIG. 2 and FIG. 3. Suppose that the high-voltage terminal is at a voltage of 5V, and that each of resistors 20 and 22 has a resistance of 1000 Ohm, and that the other components result in a load capacitor 18 having a capacitance of 0.1 μF. During signal transmission, let a second terminal and a third terminal of the interface chip 14 receive an input digital signal S having a frequency of 2.5 Hz, and let a fourth terminal be grounded equivalently. Two terminals of the load capacitor 18 are respectively Node A and Node B.

The output terminal of the receiver of the interface chip 30 is Node RO. Because the fourth terminal of the interface chip 14 is grounded, the transmitter 28 of the interface chip 14 can only transmit the "0" signal. In FIG. 3, the top graph shows the input digital signal S; the middle graph shows the signals of Node A and Node B, wherein the solid line represents the voltage of Node A and the dashed line represents the voltage of Node B; the bottom graph shows the signal of Node RO. During the time interval about between 2.5 msec and 2.7 msec, the input digital signal S is a high-level signal, and the transceiver logic of the transmitter 28 is "0". At this time, the signals of Node A and Node B are respectively shifted to a low-level voltage and a high-level voltage rapidly; the voltage of Node RO is a low-level voltage. At about 2.7 msec, the input digital signal S is shifted from a high-level signal to a low-level signal, whereby the transmitter 28 is switched off. Then, the resistors 20 and 22 are used to pull the voltages of Node A and Node B, whereby the voltages of Node A and Node B are respectively pulled up and down. The voltage of Node RO jumps to a high-level voltage as soon as the voltage of Node A is higher than the voltage of Node B. Theoretically, Node RO cannot receive signals with good quality unless the duty cycle of the voltage of Node RO is 50%. However, the duty cycle of the voltage of Node RO is 22% in fact because the resistors 20 and 22 are used to pull the voltages of Node A and Node B. Therefore, the pulling force is insufficient obviously. Refer to FIG. 4. While the input digital signal S has a frequency of 5 kHz, Node A is unlikely to have a voltage greater than the voltage of Node B. Thus, the duty cycle of the voltage of Node RO becomes 0%, and Node RO cannot receive any signal. In the abovementioned conventional technology, while the load capacitor 18 has a capacitance of 0.1 μF, the system has no chance to receive normal signals unless the maximum frequency of the input digital signal S is less than 2.5 kHz. Even though signals are received in such a case, the signal quality is very poor.

Accordingly, the present invention proposes a serial transmission driving method to overcome the abovementioned problems.

SUMMARY OF THE INVENTION

The primary objective of the present invention is to provide a serial transmission driving method, wherein two different levels of voltage are generated according to an external signal and applied to two differential buses to fast reverse the potentials of the differential buses and promote the quality of signal transmission.

To achieve the abovementioned objective, the present invention proposes a serial transmission driving method, which uses a serial transmission driving device to drive the potentials of a first terminal and a second terminal of an equivalent load capacitor. The first terminal and the second terminal are respectively connected with the serial transmission driving device through a first differential bus and a second differential bus. The first differential bus is connected with a high-potential terminal through a first equivalent resistor, and the second differential bus is connected with a low-potential terminal through a second equivalent resistor. The serial transmission driving device receives a trigger signal appearing during the transition between a turn-on signal and a turn-off signal, generates a first potential and a second potential greater than the first potential according to the trigger signal, and respectively applies the first potential and the second potential to the second differential bus and the first differential bus. Thus, the first potential and the second potential will fast change the potential of the first terminal to be greater than the potential of the second terminal. Then, the high-potential terminal and the low-potential terminal maintain the potentials of the first differential bus and the second differential bus until the turn-off signal ends.

Below, the embodiments are described in detail in cooperation with the drawings to make easily understood the technical contents, characteristics and accomplishments of the present invention.

DETAILED DESCRIPTION OF THE INVENTION

Figure 1:
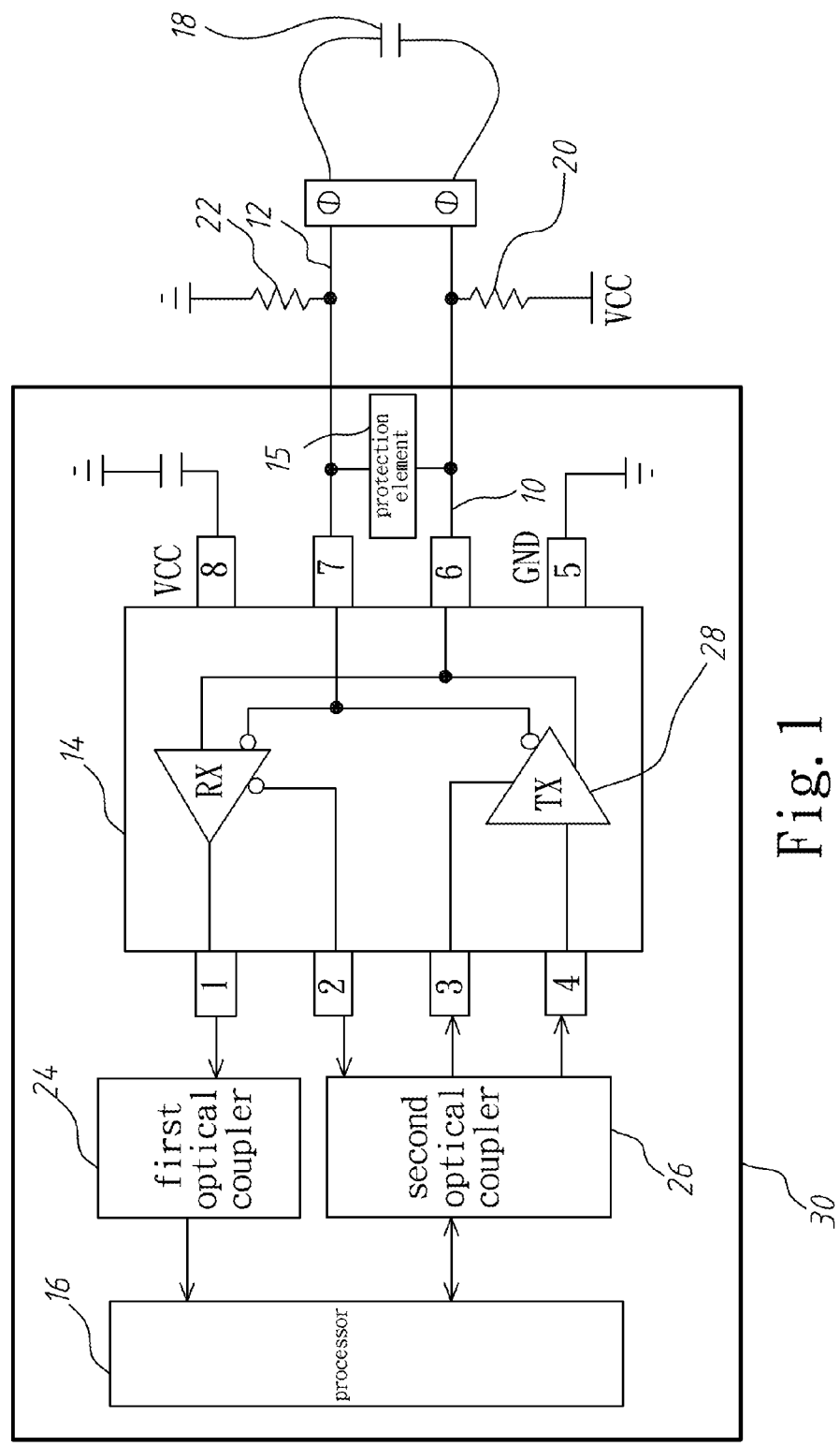
FIG. 1 is a diagram schematically showing the elements and circuit of a conventional serial transmission technology.
Figure 2:
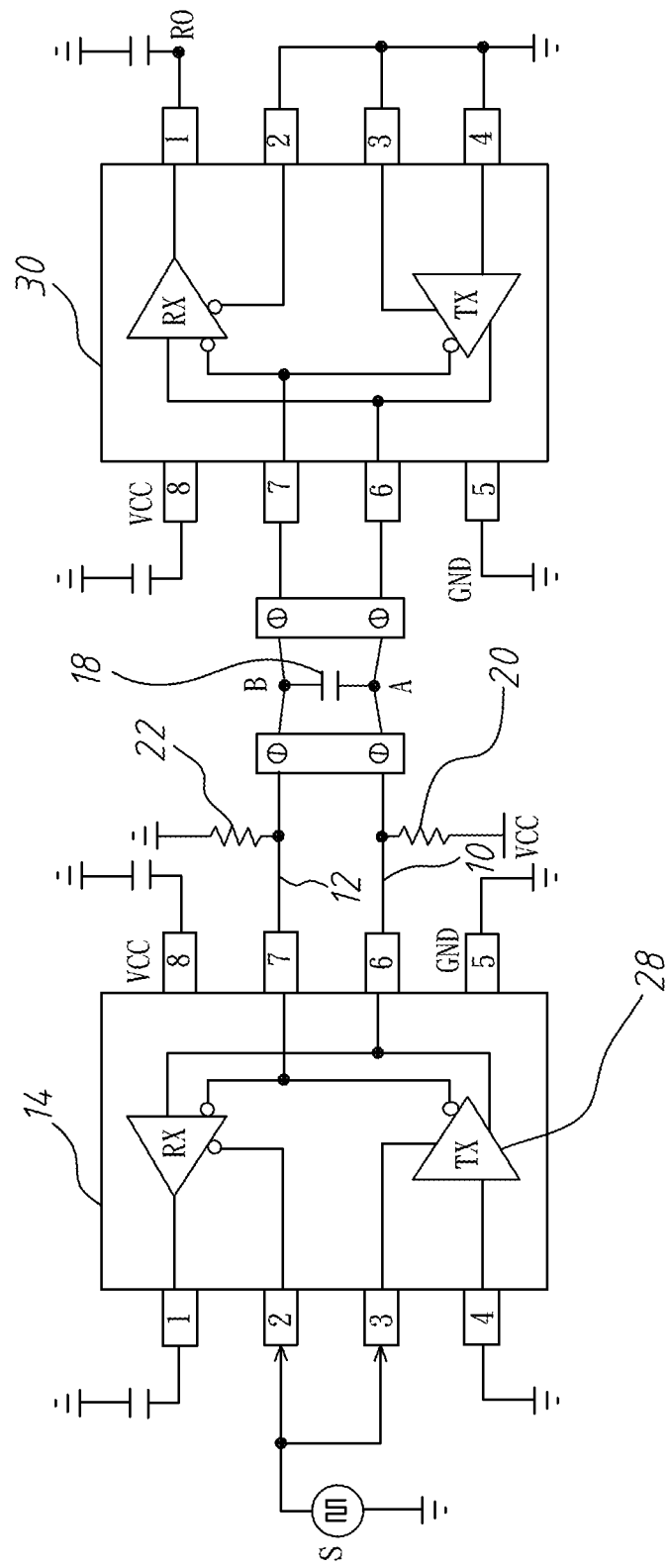
FIG. 2 is a diagram schematically showing the elements and circuit for mutually transmitting signals in a conventional serial transmission technology.
Figure 3:
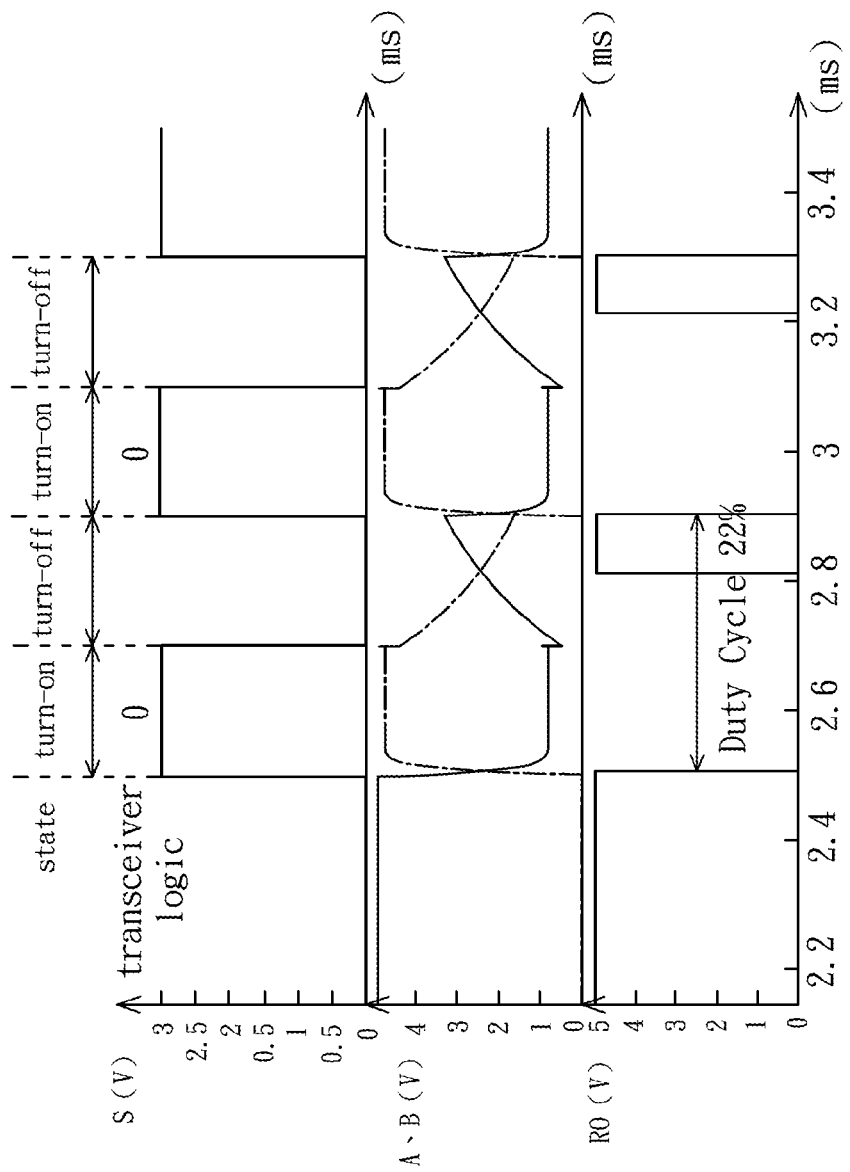
FIG. 3 is a diagram showing the waveforms of a digital input signal having a frequency of 2.5 kHz, the signals of two terminals of a load capacitor, and the signal of the receiving terminal in a conventional serial transmission technology.
Figure 4:
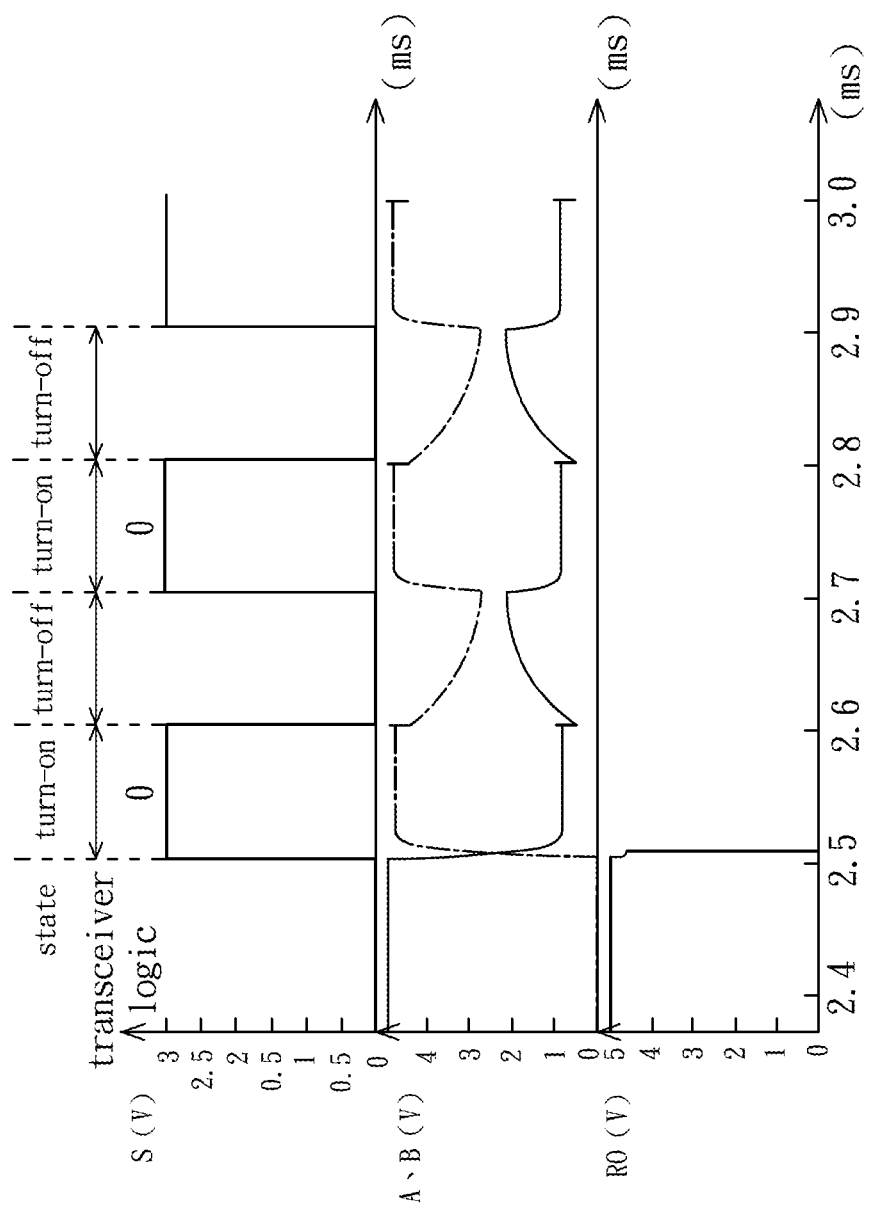
FIG. 4 is a diagram showing the waveforms of a digital input signal having a frequency of 5 kHz, the signals of two terminals of a load capacitor, and the signal of the receiving terminal in a conventional serial transmission technology.
Figure 5:
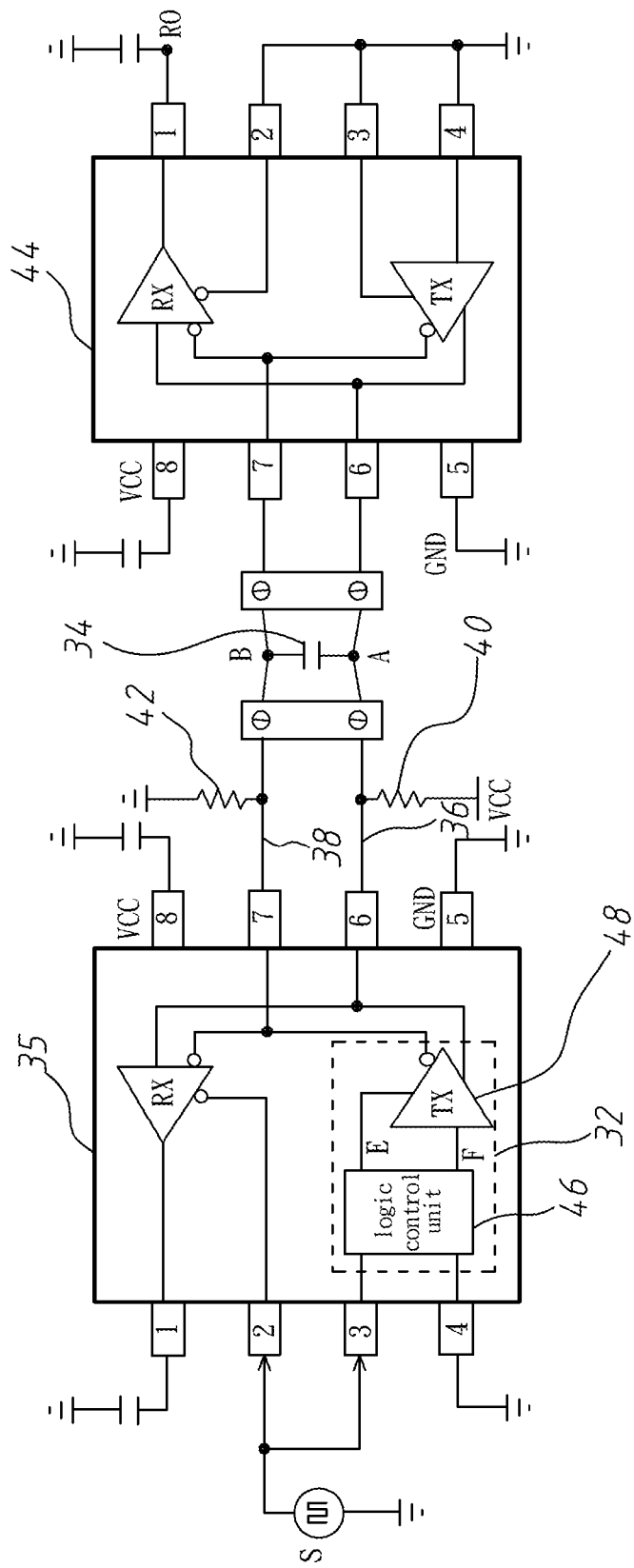
FIG. 5 is a diagram schematically showing the elements and circuit for mutually transmitting signals according to one embodiment of the present invention.
Figure 6:
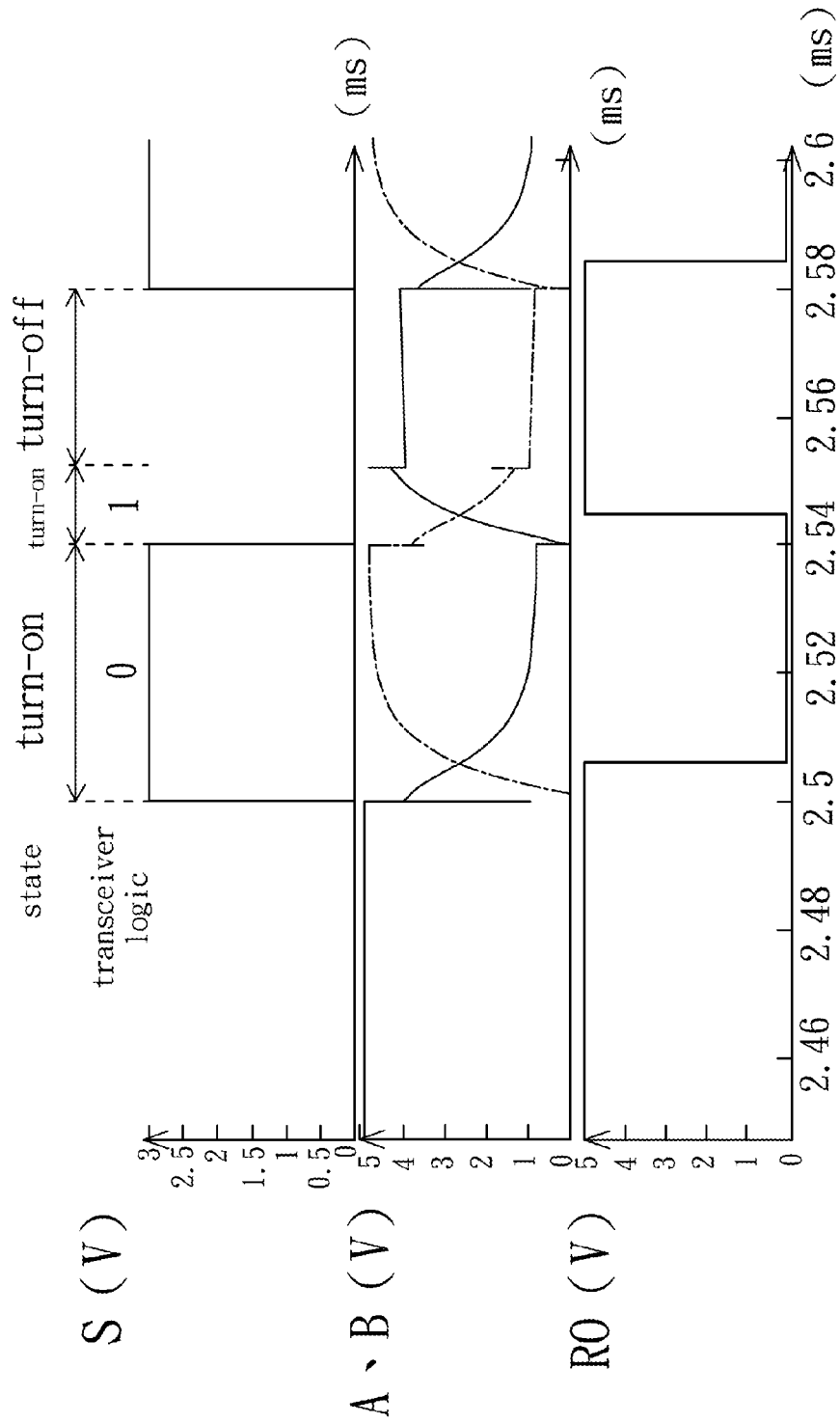
FIG. 6 is a diagram showing the waveforms of a digital input signal, the signals of two terminals of a load capacitor, and the signal of the receiving terminal according to one embodiment of the present invention.

Refer to FIG. 5 and FIG. 6. The present invention uses a serial transmission driving device 32 to drive the potentials of a first terminal and a second terminal (the potentials of Node A and Node B) of an equivalent load capacitor 34. The potentials of Node A and Node B are respectively expressed by a solid line and a dashed line in FIG. 6. The serial transmission driving device 32 is arranged in an interface chip 35. In this embodiment, the equivalent load capacitor 34 is exemplified by a capacitor having a capacitance of 0.1 μF. The first terminal and the second terminal are respectively connected with the serial transmission driving device 32 through a first differential bus 36 and a second differential bus 38. The first differential bus 36 is connected with a high-potential terminal VCC (such as a terminal having a voltage of 5V) through a first equivalent resistor 40, and the second differential bus 38 is connected with a low-potential terminal through a second equivalent resistor 42. The serial transmission driving device 32 is connected a fourth pin functioning as the external data input terminal and a third pin functioning as the external control signal terminal. In this embodiment, the data input terminal is exemplified by a ground terminal. In this embodiment, the first equivalent resistor 40 and the second equivalent resistor 42 are exemplified by resistors having a resistance of 1000 Ohm.

The present invention uses the serial transmission driving device 32 of the interface chip 35 to transmit signals to another interface chip 44. A first pin of the interface chip 44 is a signal receiving terminal RO. At the time point of 2.5 msec, the serial transmission driving device 32 receives a low-level signal from the data input terminal and a high-level signal as the digital signal S, which functions as a turn-on signal, to generate a third potential and a fourth potential greater than the third potential, and respectively applies the third potential and the fourth potential to the first differential bus 36 and the second differential bus 38. The serial transmission driving device 32 respectively supplies the third potential and the fourth potential to the first terminal and the second terminal of the equivalent load capacitor 34 through the first differential bus 36 and the second differential bus 38. Thus, the potentials of Node A and Node B respectively decreases and increases. As soon as the potential of Node B is greater than the potential of Node A, the signal receiving terminal RO is shifted from a high-level signal to a lower-level signal. At this stage, the transceiver logic is "0". At the time point of 2.54 msec, the serial transmission driving device 32 receives a trigger signal, which appears during the transition that the turn-on signal is abruptly shifted to a turn-off signal. Thus are generated a first potential and a second potential greater than the first potential, whose transceiver logic is regarded as "1". The first potential and the second potential are respectively applied to the second differential bus 38 and the first differential bus 36. Then, the first potential and the second potential are used to fast change the potential of Node A of the equivalent load capacitor 34 to be greater than the potential of Node B. The high-potential terminal connected with the first equivalent resistor 40 and the low-potential terminal connected with the second equivalent resistor 42 are used to maintain the potentials of the first differential bus 36 and the second differential bus 38 until the turn-off signal ends. The turn-off signal is a low-level signal of the digital signal S. In this embodiment, the digital signal has a frequency of 12.5 kHz. Observed from the signal receiving terminal RO, the duty cycle of the received signal is 50%, which proves that the present invention can promote the signal transmission quality. In this embodiment, the transmission time of the turn-off signal is longer than the transmission time of the first potential and the second potential. In other embodiments, the transmission time of the turn-off signal may be equal to the transmission time of the first potential and the second potential, and the signal transmission quality is also promoted.

In the present invention, the serial transmission driving device 32 includes a logic control unit 46 and a transmitter 48. The input terminals of the logic control unit 46 are respectively connected with the low-potential terminal (functioning as the data input terminal) and the control terminal (receiving the digital signal S) through the fourth pin and the third pin of the interface chip 35. The logic control unit 46 processes the control signal of the control terminal and the data signal and outputs a control signal E and an data input signal F. The control signal of the control terminal includes the turn-on signal and the turn-off signal. The data signal includes a logic "1" and a logic "0". The logic control unit 46 outputs the control signal E and the data input signal F into the transmitter 48 through two input terminals of the transmitter 48. Two output terminals of the transmitter 48 are respectively connected with the first differential bus 36 and the second differential bus 38. According to the trigger signal appearing during the transition between the turn-on signal and the turn-off signal, the logic control unit 46 controls the transmitter 48 to respectively apply the second potential and the first potential to the first differential bus 36 and the second differential bus 38.

In conclusion, the present invention uses the pushing force of the transmitter to enhance the pulling force of the resistors while receiving the trigger signal appearing during the transition between the turn-on signal and the turn-off signal, whereby the potentials of the differential buses are rapidly reversed, and whereby the signal transmission quality is promoted.

What is claimed is:

1. A serial transmission driving method, which uses a serial transmission driving device to drive potentials of a first terminal and a second terminal of an equivalent load capacitor, and said first terminal and said second terminal are respectively connected with said serial transmission driving device through a first differential bus and a second differential bus, and said first differential bus is connected with a high-potential terminal through a first equivalent resistor, and said second differential bus is connected with a low-potential terminal through a second equivalent resistor, and said serial transmission driving method comprises steps:

said serial transmission driving device receives a turn-on signal, generates a third potential and a fourth potential greater than said third potential according to said turn-on signal, and respectively applies said third potential and said fourth potential to said first differential bus and said second differential bus, and said third potential and said fourth potential is supplied to said first terminal and said second terminal through said first differential bus and said second differential bus; and said serial transmission driving device receiving a trigger signal appearing during transition between said turn-on signal and a turn-off signal, generating a first potential and a second potential greater than said first potential according to said trigger signal, respectively applying said first potential and said second potential to said second differential bus and said first differential bus, using said first potential and said second potential to fast change a potential of said first terminal to be greater than a potential of said second terminal, and using said high-potential terminal and said low-potential terminal to maintain potentials of said first differential bus and said second differential bus until said turn-off signal ends.

2. The serial transmission driving method according to claim 1, wherein said turn-on signal and said turn-off signal are respectively a high-level signal and a low-level signal of a digital signal.

3. The serial transmission driving method according to claim 1, wherein transmission time of said turn-off signal is equal to or greater than transmission time of said first potential and said second potential.

* * * * *